US010843300B2

(12) United States Patent
Hayashi et al.

(10) Patent No.: US 10,843,300 B2
(45) Date of Patent: Nov. 24, 2020

(54) METHOD FOR PRODUCING SOLDERED PRODUCT (71) Applicant: ORIGIN COMPANY, LIMITED, Saitama (JP)

(72) Inventors: Yukiko Hayashi, Saitama (JP); Arisa Shiraishi, Saitama (JP); Naoto Ozawa, Saitama (JP); Takayuki Suzuki, Saitama (JP)

(73) Assignee: ORIGIN COMPANY, LIMITED, Saitama (JP)

( * ) Notice: Subject to any disclaimer, the term of this patent is extended or adjusted under 35 U.S.C. 154(b) by 0 days.

(21) Appl. No.: 15/764,268

(22) PCT Filed: Sep. 29, 2016

(86) PCT No.: PCT/JP2016/078959
§ 371 (c)(1),
(2) Date: Jul. 12, 2018

(87) PCT Pub. No.: WO2017/057649
PCT Pub. Date: Apr. 6, 2017

(65) Prior Publication Data
US 2018/0326545 A1 Nov. 15, 2018

(30) Foreign Application Priority Data
Sep. 30, 2015 (JP) .................... 2015-195198

(51) Int. Cl.
*B23K 1/00* (2006.01)
*B23K 37/04* (2006.01)
(Continued)

(52) U.S. Cl.
CPC ............ *B23K 37/04* (2013.01); *B23K 1/0016* (2013.01); *B23K 1/20* (2013.01); *B23K 1/203* (2013.01);
(Continued)

(58) Field of Classification Search
CPC ...... B23K 37/04; B23K 35/3613; B23K 1/20; B23K 1/203; B23K 1/0016;
(Continued)

(56) References Cited

U.S. PATENT DOCUMENTS 4,712,721 A * 12/1987 Noel ..................... B23K 3/06
228/180.22
6,445,589 B2 * 9/2002 Chengalva ............. H05K 3/303
174/255

(Continued)

FOREIGN PATENT DOCUMENTS

CN 102960077 A 3/2013
EP 2587900 A1 5/2013
(Continued)

OTHER PUBLICATIONS

Machine translation of JP-2004-253769A (no date available).*
(Continued)

*Primary Examiner* — Kiley S Stoner
(74) *Attorney, Agent, or Firm* — Squire Patton Boggs (US) LLP (57) ABSTRACT The present invention relates to a method for producing a soldered product by which soldering can be accomplished without using a jig. The method for producing a soldered product of the present invention comprises:
a provision step of providing a solder and a temporary fixing agent for temporarily fixing the solder; a temporary fixing step of temporarily fixing the solder to a soldering target with the temporary fixing agent; a vaporization step of placing the soldering target with the solder temporarily fixed thereto in a vacuum or heating the soldering target with the solder temporarily fixed thereto to a predetermined temperature lower than the melting temperature of the solder, to vaporize the temporary fixing agent in order to form gaps between
(Continued)

the solder and the soldering target; a reduction step, performed concurrently with or after the vaporization step, of reducing, with a reducing gas at a predetermined temperature lower than the melting temperature of the solder, the solder and the soldering target left in the vaporization step; and a solder melting step, performed after the reduction step, of heating the soldering target to a predetermined temperature equal to or higher than the melting temperature of the solder to melt the solder.

11 Claims, 3 Drawing Sheets

(51) Int. Cl.
| | |
|---|---|
| B23K 1/20 | (2006.01) |
| H01L 23/00 | (2006.01) |
| H05K 3/34 | (2006.01) |
| B23K 35/22 | (2006.01) |
| B23K 35/36 | (2006.01) |
| B23K 35/38 | (2006.01) |
| B23K 101/42 | (2006.01) |
| B23K 101/40 | (2006.01) |
| B23K 35/26 | (2006.01) |

(52) U.S. Cl.
CPC .............. *B23K 35/22* (2013.01); *B23K 35/36* (2013.01); *B23K 35/3612* (2013.01); *B23K 35/3613* (2013.01); *B23K 35/383* (2013.01); *H01L 24/29* (2013.01); *H01L 24/75* (2013.01); *H01L 24/83* (2013.01); *H05K 3/34* (2013.01); *B23K 35/262* (2013.01); *B23K 2101/40* (2018.08); *B23K 2101/42* (2018.08); *H01L 2224/29109* (2013.01); *H01L 2224/29111* (2013.01); *H01L 2224/29113* (2013.01); *H01L 2224/29118* (2013.01); *H01L 2224/29139* (2013.01); *H01L 2224/29147* (2013.01); *H01L 2224/32225* (2013.01); *H01L 2224/7525* (2013.01); *H01L 2224/75102* (2013.01); *H01L 2224/75901* (2013.01); *H01L 2224/83002* (2013.01); *H01L 2224/8309* (2013.01); *H01L 2224/83065* (2013.01); *H01L 2224/83075* (2013.01); *H01L 2224/83101* (2013.01); *H01L 2224/83801* (2013.01); *H01L 2224/83815* (2013.01); *H01L 2224/83948* (2013.01); *H01L 2924/014* (2013.01)

(58) Field of Classification Search
CPC .. B23K 35/3612; B23K 35/383; B23K 35/36; B23K 35/22; B23K 2101/40; B23K 35/262; B23K 2101/42; B23K 1/00–206; B23K 2101/36–42; H01L 24/75; H01L 24/29; H01L 24/83; H01L 2224/29118; H01L 2224/29109; H01L 2224/29113; H01L 2924/014; H01L 2224/29139; H01L 2224/29147; H01L 2224/7525; H01L 2224/83815; H01L 2224/29111; H01L 2224/83101; H01L 2224/83075; H01L 2224/83065; H01L 2224/75901; H01L 2224/32225; H01L 2224/8309; H01L 2224/83801; H01L 2224/75102; H01L 2224/83002; H01L 2224/83948; H05K 3/34

USPC ...... 228/175–176, 218–221, 245–262, 233.2
See application file for complete search history.

(56) References Cited

U.S. PATENT DOCUMENTS

| | | | | |
|---|---|---|---|---|
| 6,841,874 B1* | 1/2005 | Paek | ................ | H01L 23/3114 257/738 |
| 2002/0033525 A1* | 3/2002 | Ohuchi | ................ | H01L 21/563 257/679 |
| 2002/0105056 A1* | 8/2002 | Uchiyama | ............... | H01L 24/10 257/618 |
| 2004/0070084 A1* | 4/2004 | Kuramoto | ........... | H01L 21/4853 257/779 |
| 2004/0105223 A1* | 6/2004 | Okada | ................... | H01L 21/486 361/679.01 |
| 2005/0001014 A1* | 1/2005 | Takeuchi | ............. | B23K 1/0016 228/110.1 |
| 2006/0169750 A1* | 8/2006 | Tanaka | ................... | B23K 1/206 228/205 |
| 2007/0007323 A1* | 1/2007 | Russell | ............... | B23K 1/0016 228/246 |
| 2010/0213247 A1* | 8/2010 | Egan | .................... | C09K 3/1436 228/220 |
| 2011/0215483 A1* | 9/2011 | Zhang | .................... | H01L 24/75 257/779 |
| 2012/0318854 A1* | 12/2012 | Tsang | ................. | B23K 35/3615 228/180.22 |
| 2013/0105558 A1* | 5/2013 | Abe | ..................... | B23K 1/0016 228/179.1 |
| 2013/0119119 A1* | 5/2013 | Horng | ................. | B23K 1/0016 228/246 |
| 2013/0175323 A1* | 7/2013 | Zhang | ................. | B23K 1/0016 228/4.1 |
| 2014/0034708 A1* | 2/2014 | Cheung | ................ | H01L 31/186 228/103 |
| 2015/0053389 A1* | 2/2015 | Sjodin | ...................... | F28F 9/00 165/185 |
| 2015/0299509 A1* | 10/2015 | Tsang | ................ | B23K 35/3613 438/64 |
| 2017/0048982 A1* | 2/2017 | Ishihara | ................. | H05K 3/34 |
| 2017/0077043 A1* | 3/2017 | Takemura | .............. | H01L 24/24 |
| 2017/0290099 A1* | 10/2017 | Takebayashi | ........... | B23K 3/04 |

FOREIGN PATENT DOCUMENTS

| | | | | |
|---|---|---|---|---|
| JP | H 08242069 A | | 9/1996 | |
| JP | H 11204926 A | | 7/1999 | |
| JP | 11224981 A | * | 8/1999 | ............. H01L 24/11 |
| JP | H11-224981 A | | 8/1999 | |
| JP | 2002-210555 A | | 7/2002 | |
| JP | 2004-253769 A | | 9/2004 | |
| JP | 2005-509269 A | | 4/2005 | |
| JP | 2006-222381 A | | 8/2006 | |
| JP | 2007-180447 A | | 7/2007 | |
| JP | 2012-033518 A | | 2/2012 | |
| JP | 2012033518 A | * | 2/2012 | ........... B23K 1/0016 |
| JP | 2013-065662 A | | 4/2013 | |
| JP | 6042956 B1 | * | 12/2016 | ............. B23K 35/22 |
| JP | 2017069459 A | * | 4/2017 | ............. B23K 35/22 |
| WO | WO-2012002273 A1 | * | 1/2012 | ............ B23K 1/0016 |

OTHER PUBLICATIONS

Office Action dated Sep. 27, 2018 for Chinese Patent Application No. 201680052916.9, with English translation, 12 pages.
EPO Communication dated Jul. 9, 2018 issued for European Patent Application No. 16851820.7, 8 pages.
International Search Report for PCT/JP2016/078959, dated Apr. 6, 2017 (5 pgs).

\* cited by examiner

METHOD FOR PRODUCING SOLDERED PRODUCT

TECHNICAL FIELD

The present invention relates to a method for producing a soldered product, and, more particularly, to a method for producing a soldered product by which soldering can be accomplished without using a jig when soldering is carried out in a soldering apparatus.

BACKGROUND ART

In solder bonding, generally, a jig (also called pallet) is used to fix soldering targets and solder so that the soldering targets and solder can be held in a predetermined position and bonded to each other without misalignment.

Patent Document 1 discloses a positioning jig for a semiconductor chip that enables a semiconductor chip to be placed in a predetermined position without misalignment on an insulated circuit board and properly solder-bonded thereto (Patent Document 1, paragraphs 0001 and 0006 to 0010).

However, such a jig must be prepared for each shape of the soldering targets depending on its shape. In addition, attachment and detachment of a jig take time and place a burden on an operator. Another problem is that heat for solder welding is taken away by the jig.

PRIOR ART DOCUMENT

Patent Document

Patent Document 1: Japanese patent application publication no. 2013-65662 (JP-A-2013-65662)

SUMMARY OF THE INVENTION

Problem to be Solved by the Invention

In view of the above problems, an object of the present invention is to provide a method for producing a soldered product by which soldering can be accomplished without using a jig.

Means for Solving the Problem

For accomplishing the above object, a method for producing a soldered product according to a first aspect of the present invention comprises: a provision step of providing a solder and a temporary fixing agent for temporarily fixing the solder; a temporary fixing step of temporarily fixing the solder to a soldering target with the temporary fixing agent; a vaporization step of placing the soldering target with the solder temporarily fixed thereto in a vacuum or heating the soldering target with the solder temporarily fixed thereto to a predetermined temperature lower than the melting temperature of the solder, to vaporize the temporary fixing agent in order to form gaps between the solder and the soldering target; a reduction step, performed concurrently with or after the vaporization step, of reducing, with a reducing gas at a predetermined temperature lower than the melting temperature of the solder, the solder and the soldering target left in the vaporization step; and a solder melting step, performed after the reduction step, of heating the soldering target to a predetermined temperature equal to or higher than the melting temperature of the solder to melt the solder.

A solder means an alloy utilized for soldering.

The term "in a vacuum" means in a space having a pressure lower than that of atmosphere (so-called a reduced pressure).

A surface of a material that apparently looks smooth and flat has countless irregularities in an atomic or molecular level. Thus, with the above configuration, gaps are formed between the solder and the soldering targets because of the above irregularities after the vaporization of the temporary fixing agent. In the present invention, effective reduction of the solder and the soldering targets can be achieved by introducing the reducing gas into the gaps.

In addition, creating a vacuum accelerates vaporization of the temporary fixing agent. Further, a temporary fixing agent having a boiling point under normal pressure is higher than the reduction temperature can be used. Because the temporary fixing agent can be vaporized efficiently as described above, the types of usable solvents can be increased.

A method for producing a soldered product according to a second aspect of the present invention is the method for producing a soldered product according to the above first aspect of the present invention, further comprising an inert gas step, performed before the vaporization step, of placing the soldering target with the solder temporarily fixed thereto in an inert gas.

With this configuration, it is possible to prevent the solder and the soldering targets from being oxidized and corroded by a trace amount of oxygen or other gases present in the atmosphere.

A method for producing a soldered product according to a third aspect of the present invention is the method for producing a soldered product according to the above first or second aspect of the present invention, in which, in the vaporization step, the temporary fixing agent is vaporized by heating the soldering target in a vacuum.

With this configuration, vaporization of the temporary fixing agent can be accelerated. Further, a temporary fixing agent having a boiling point under normal pressure is higher than the reduction temperature can be used. Because the temporary fixing agent can be vaporized efficiently as described above, the types of usable solvents can be increased.

A method for producing a soldered product according to a fourth aspect of the present invention is the method for producing a soldered product according to any one of the above first to third aspects of the present invention, in which, in the reduction step, the soldering target is reduced by introducing the reducing gas into the gaps while the soldering target is in the vacuum.

With this configuration, it is possible to facilitate penetration of the reducing gas into the gap between the solder and the soldering targets.

A method for producing a soldered product according to a fifth aspect of the present invention is the method for producing a soldered product according to any one of the above first to fourth aspects of the present invention, in which, in the solder melting step, the solder is melted by heating the soldering target to a temperature equal to or higher than the melting temperature of the solder while the soldering target is in the vacuum, and in which the method further comprises: a vacuum breaking step, performed after the solder melting step, of increasing pressure to break the vacuum in order to compress or eliminate cavities (voids) in the solder; and a cooling step, performed after the vacuum breaking step, of cooling the soldering target.

With this configuration, the cavities (voids) can be squashed while the solder is in a molten state in the vacuum breaking step and the solder can be solidified after the cavities are squashed. Thus, the decrease of fatigue life caused by voids in the solder can be restrained.

A method for producing a soldered product according to a sixth aspect of the present invention is the method for producing a soldered product according to any one of the above first to fifth aspects of the present invention, in which the solder is a preformed solder, the temporary fixing agent contains a solvent and a viscosity modifier, and the temporary fixing agent has a boiling point lower than the melting temperature of the solder.

With this configuration, because the boiling point of the temporary fixing agent is lower than the solder melting temperature, the temporary fixing agent completely vaporizes before the solder reaches its melting temperature and is prevented from being entrained into the solder after the solder melts.

A method for producing a soldered product according to a seventh aspect of the present invention is the method for producing a soldered product according to any one of the above first to fifth aspects of the present invention, in which the solder is a preformed solder, the temporary fixing agent is a solvent, and the solvent has a boiling point lower than the melting temperature of the solder.

With this configuration, because the boiling point of the solvent is lower than the solder melting temperature, the solvent completely vaporizes before the solder reaches its melting temperature and is prevented from being entrained into the solder after the solder melts. In addition, the temporary fixing agent can be prepared very easily. Further, the temporary fixing agent can be formed without using harmful substances such as active materials.

A method for producing a soldered product according to an eighth aspect of the present invention is the method for producing a soldered product according to any one of the above first to seventh aspects of the present invention, in which the reducing gas is a formic acid gas.

With this configuration, the solder and the soldering target can be reduced at a temperature lower than 300° C.

Effect of the Invention

According to the present invention, because no jig is used in soldering, the burden on an operator can be reduced, and the time for the soldering step can be reduced with improved production efficiency. In addition, there is no possibility that heat for solder welding is taken away. Further, because the temporary fixing agent vaporizes, flux residues and so on that may remain after soldering can be reduced and the soldered product needs no washing.

DESCRIPTION OF EMBODIMENTS

This application is based on Japanese Patent Application No. 2015-195198 filed on Sep. 30, 2015 in Japan, the contents of which are hereby incorporated in its entirety by reference into the present application, as part thereof. The present invention will become more fully understood from the detailed description given hereinbelow. Further range of application of the present invention will become clearer from the detailed description given hereinbelow. However, the detailed description and the specific embodiment are illustrated of desired embodiments of the present invention and are described only for the purpose of explanation. Various changes and modifications will be apparent to those ordinary skilled in the art within the spirit and scope of the present invention on the basis of the detailed description. The applicant has no intention to give to public any disclosed embodiment. Among the disclosed changes and modifications, those which may not literally fall within the scope of the patent claims constitute, therefore, a part of the present invention in the sense of doctrine of equivalents.

Description will hereinafter be made of an embodiment of the present invention with reference to the drawings. The same or corresponding members are denoted with the same or similar reference numerals in all the drawings, and their descriptions are not repeated. Further, the present invention is not limited to the following embodiments.

[Outline of Method for Producing Soldered Product]

Figure 1:
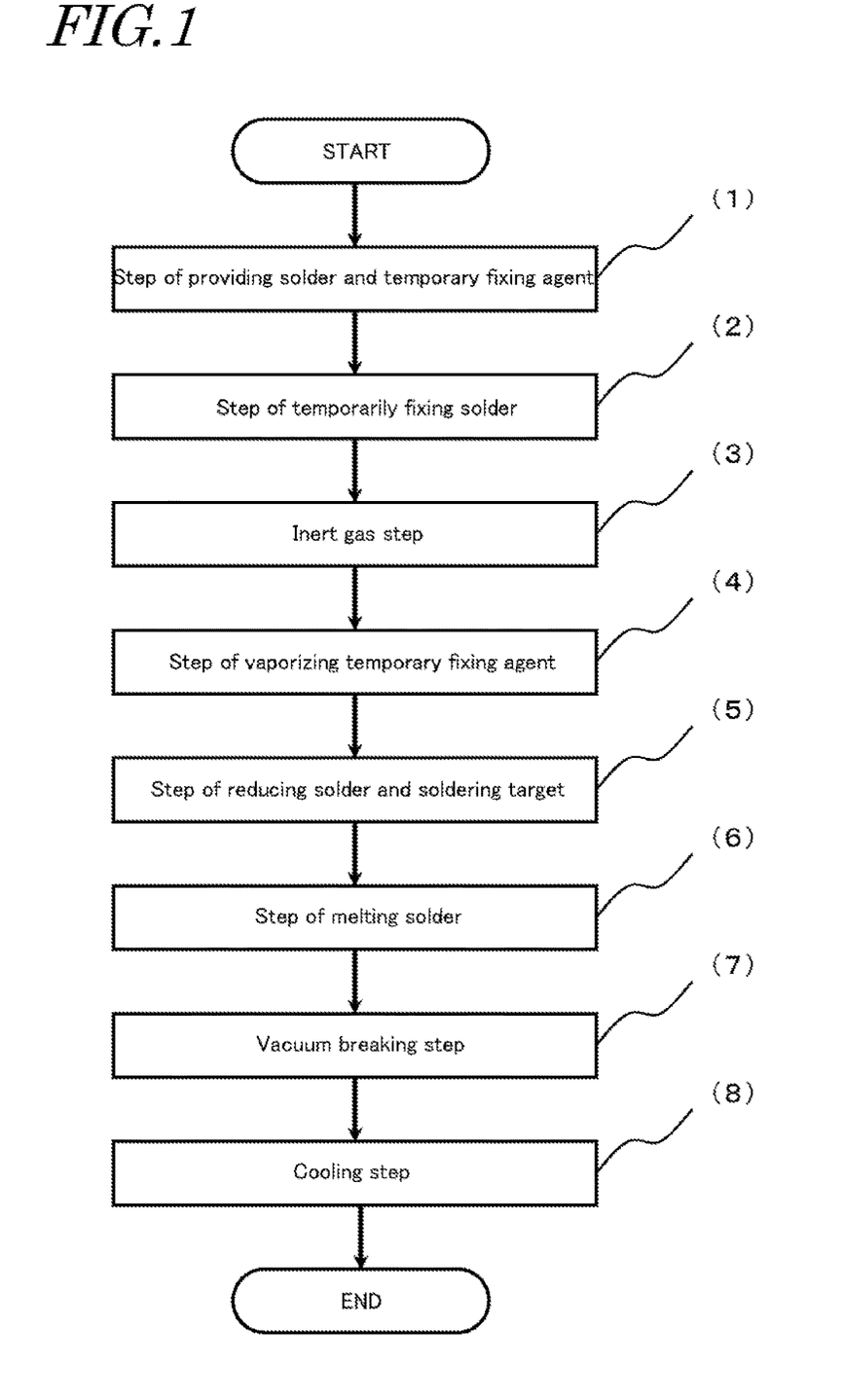
FIG. 1 is a flowchart, illustrating a method for producing a soldered product of the present invention.

Referring to FIG. 1, a method for producing a soldered product according to a first embodiment of the present invention is described. The method for producing a soldered product of the present application is a production method in a case where a soldering apparatus is used to carry out soldering.

FIG. 1 is a flowchart illustrating the method for producing a soldered product. The invention of the present application includes (1) a step of providing a solder and a temporary fixing agent, (2) a step of temporarily fixing the solder, (4) a step of vaporizing the temporary fixing agent, (5) a step of reducing the solder and soldering targets, and (6) a step of melting the solder. As necessary, the method may further include (3) an inert gas step, (7) a vacuum breaking step, or (8) a cooling step.

In the following, each step is described in detail.

(1) Step of Providing a Solder and a Temporary Fixing Agent

This is a step of preparing a solder and a temporary fixing agent. The term "prepare" means creating a state where a solder and a temporary fixing agent are present. A solder and a temporary fixing agent which already exist may be provided, or a temporary fixing agent may be provided by preparation.

A temporary fixing agent is an agent that is used to fix the solder to the soldering target temporarily.

(2) Step of Temporarily Fixing the Solder

This is a step where the temporary fixing agent is applied to the soldering target and the solder is placed on the applied temporary fixing agent to fix the solder temporarily. The method for applying the temporary fixing agent is not particularly limited.

(3) Inert Gas Step

This is a step where the solder and the soldering target are placed in an inert gas atmosphere. As the inert gas, nitrogen or argon may be used.

(4) Step of Vaporizing the Temporary Fixing Agent

This is a step where the temporary fixing agent is vaporized by heating or depressurizing (vacuuming).

For example, when the soldering target, the temporary fixing agent and the solder are heated, the temporary fixing agent starts to vaporize first. When the temporary fixing agent vaporizes, the solder and the soldering target, which have a melting temperature higher than the vaporization temperature, do not melt and gaps are formed between the solder and the soldering target because of their surface irregularities.

(5) Step of Reducing the Solder and Soldering Target

This is a step where heating is continued to the reduction temperature to vaporize the temporary fixing agent completely and, simultaneously, to reduce the solder and the soldering target with the reducing gas. The reduction may take place either simultaneously with or after the vaporization of the temporary fixing agent. The reduction may take place under either normal pressure or reduced pressure (vacuum).

Here, the term "reduction" means a process of removing oxide films or the like on surfaces of the soldering target and the solder during soldering. Examples of the reducing gas include a formic acid gas, gases of carboxylic acids, gases of organic acids other than carboxylic acids, gases of organic compounds other than organic acids and reductive gases other than organic compounds (such as a hydrogen gas). From the viewpoint of lowering the reduction temperature to below the melting temperature of the solder and the viewpoint of availability, a formic acid gas is preferable as the reducing gas.

(6) Step of Melting the Solder

This is a step where heating is further continued to the solder melting temperature to accomplish soldering.

A solder that does not melt at the temperature for reduction with the reducing gas and under the gas pressure during reduction is preferred. In other words, the melting temperature of the solder is any temperature higher than the reduction temperature, and is preferably 10 to 50° C. higher than the reduction temperature in this embodiment.

(7) Vacuum Breaking Step

This is a step where, when solder is melted under vacuum, the pressure is increased after the solder is melted to compress cavities (voids) in the solder. By this step, voids formed in the solder by air entrained in the molten solder can be reduced in size or eliminated.

(8) Cooling Step

This is a step where the molten solder is cooled and solidified. The cooling may be either natural cooling or forced cooling. The soldered product is produced by the solidification of the molten solder. In the method of the present invention, the soldered product does not need washing because no residue remains.

In the present invention, the vaporization temperature of the temporary fixing agent, the melting points of the solder and the soldering target and the reduction temperature of the reducing gas have the following relationship under a predetermined gas pressure (such as normal pressure or reduced pressure). The term "melting point" means the temperature at which the substance melts regardless of the gas pressure.

Vaporization temperature of temporary fixing agent-
≤reduction temperature<melting points of solder
and soldering target

[Solder]

In the invention of the present application, a preformed (molded) solder is used. Because a preformed solder is used, the amount of solder can be increased compared to soldering using a paste alone. In addition, when a preformed solder is used, the precise solder amount can be determined.

In this specification, the term "solder" refers to a preformed solder.

The alloy composition of the solder is not particularly limited. Various types of solder alloys presently used in bump formation or mounting on printed-circuit boards can be used. Examples include lead-free solder alloys used as lead-free solders, such as Sn—Ag solder, Sn—Ag—Cu solder, Sn—Ag—Cu—Bi solder, Sn—Ag—In—Bi solder, Sn—Cu solder, Sn—Zn solder and Sn—Bi solder.

The solder may be in any form such as foil, sheet, washer, ring, pellet, disk, ribbon, ingot (rod), wire (cable), powder (grains), cube, cuboid, ball and tape as long as it can be fixed temporary with a temporary fixing agent. For reasons for easiness of temporary fixing, a foil or ball shape is preferred. The solder foil has a thickness of approximately 100 μm, for example.

[Temporary Fixing Agent]

A temporary fixing agent is used to temporarily fix the solder to the soldering target. For example, by using only a solvent as a temporary fixing agent, a thin and light object such as solder foil can be temporarily fixed by the surface tension of the solvent. In other words, the temporary fixing agent may be a solvent. Alternatively, a viscosity modifier may be added to a solvent depending on the shape of the solder. The viscosity of the temporary fixing agent is adjusted to a level at which the solder can be temporarily fixed, and the amount of the viscosity modifier is adjusted as appropriate depending on the shape of the solder.

As described above, the types and amounts of the solvent and viscosity modifier may be changed as appropriate based on the degree of viscosity adjustment. The solvent and the viscosity modifier may be mixed with stirring, or mixed with heating and stirring.

Preferably, the temporary fixing agent completely vaporizes at the gas pressure and temperature at which the solder melts and does not leave any residues after solder bonding.

Solvent

As the solvent, a commonly used liquid solvent or high-viscosity solvent may be used. Examples include aniline, amyl alcohol, isobutyl alcohol, ethanol, ethylene glycol monomethyl ether, ethylene glycol monomethyl ether acetate, ethyl lactate, ethylene glycol ethyl ether, ethylene glycol ethyl ether acetate, ethylene glycol propyl ether, diethylene glycol dimethyl ether, dipropylene glycol dimethyl ether, diethylene glycol ethyl methyl ether, diethylene glycol isopropyl methyl ether, dipropylene glycol monomethyl ether, diethylene glycol diethyl ether, diethylene glycol monoethyl ether, dimethyl sulfoxide, propylene glycol, propylene glycol monomethyl ether, propylene glycol methyl ether acetate, propylene glycol diacetate, propanol, butyl alcohol, water, 2-phenoxy ethanol, 1,4-dioxane, and 3-methoxy-3-methyl-1-butanol. These solvents may be used singly or in combination of two or more kinds. The solvent is preferably ethanol, propanol or water for reasons of availability, environmental impact and low boiling point.

Preferably, the solvent vaporizes at gas pressure and temperature equal to or lower than the gas pressure and temperature during reduction. The temperature at which the solvent vaporizes is any temperature equal to or lower than the reduction temperature, and is, for example, 0 to 100° C. A mechanism for adjusting the pressure of atmosphere enables a solvent that has a boiling point higher than the reduction temperature under normal pressure to vaporize at a temperature lower than the reduction temperature. As described above, the solvent needs to vaporize at a temperature equal to or lower than the reduction temperature under a predetermined gas pressure.

Viscosity Modifier

The viscosity modifier adjusts the viscosity of the temporary fixing agent or promotes adherence of substances. Preferably, the viscosity modifier vaporizes at gas pressure and temperature equal to or lower than those during reduction and is not an active material (non-ionic). Because the reduction temperature is determined according to the type of the reducing gas, the viscosity modifier is selected as appropriate depending on the reducing gas.

Examples include urea, silica, polymers (such as acrylic acid-based polymers and carboxylic acid-based polymers), hardened castor oil, beeswax and carnauba wax. These viscosity modifiers may be used singly or in combination of two or more kinds.

A viscosity modifier that can be vaporized at the gas pressure and temperature during reduction is preferred because the viscosity modifier does not remain in the solder as residues and because the viscosity modifier does not cause corrosion of the soldering targets (metals) and eliminates the need for washing since it not an active material.

As one example, when formic acid is used as the reducing gas and the reduction temperature is about 200° C., it is preferred that the temporary fixing agent vaporizes by the time of reduction. Thus, the temporary fixing agent may be vaporized during the temperature rise or a temperature-maintaining period for vaporizing the temporary fixing agent may be provided. The use of formic acid is preferred because formic acid enables reduction to be carried out at a lower temperature compared to other reducing gases.

[Details of the Method for Producing a Soldered Product]

Figure 2:
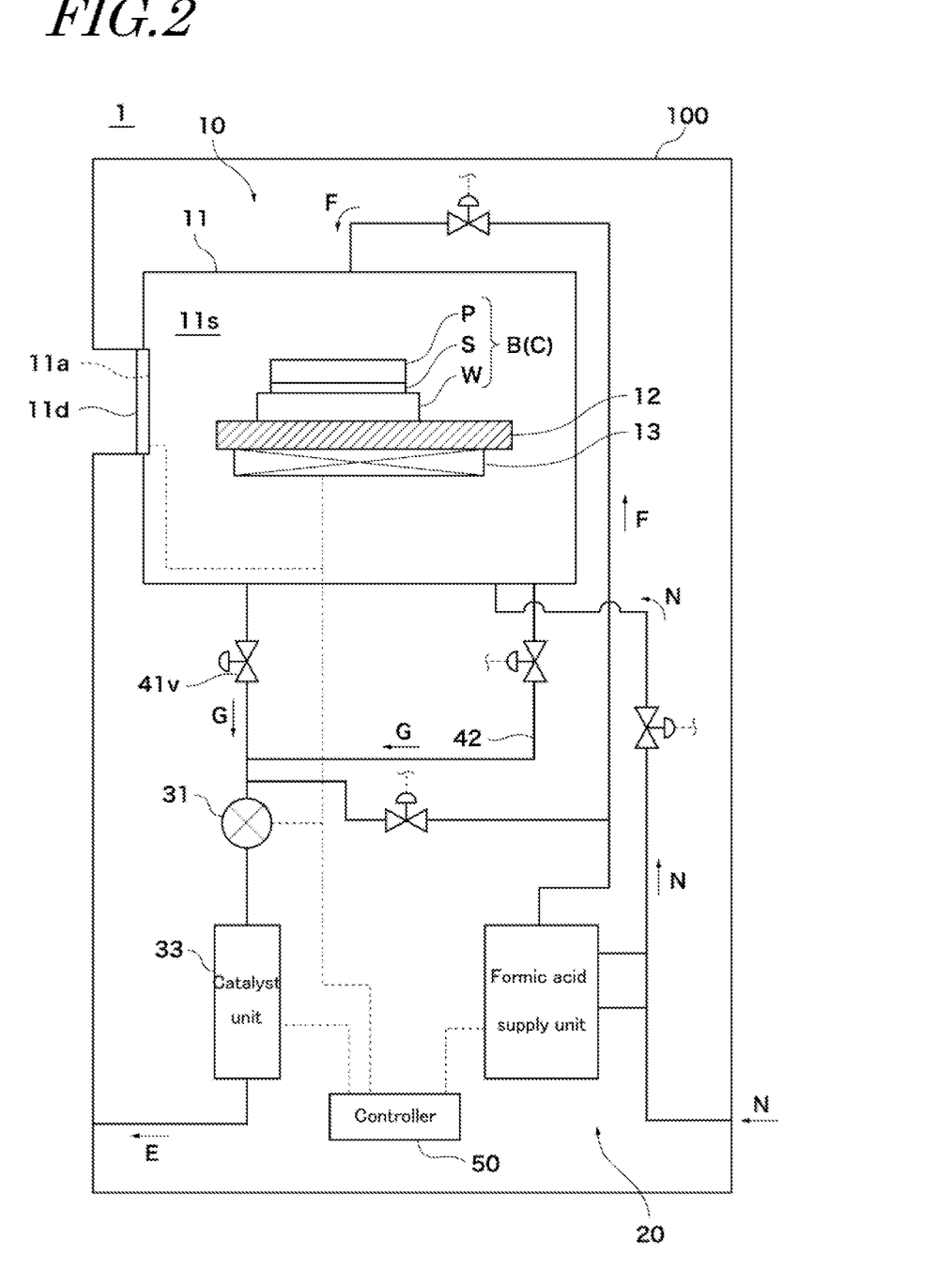
FIG. 2 is a general configuration diagram of a soldering apparatus 1.

Using the soldering apparatus 1 in FIG. 2, the steps relating to the apparatus in the method for producing a soldered product of the present application are described more specifically. However, the apparatus that can be used in the present invention is not limited to the soldering apparatus 1.

FIG. 2 is a general configuration diagram of the soldering apparatus 1. The soldering apparatus 1 comprises: a treatment part 10 having a chamber 11 defining a treatment space 11s that is a space in which the members to be bonded are soldered to each other; a formic acid supply part 20 that supplies a formic acid gas F as a reducing gas to the chamber 11; a catalyst unit 33 that detoxifies the formic acid gas F in the soldering apparatus 1 before it is discharged; a controller 50 that controls the operation of the soldering apparatus 1; and a housing 100 that houses the treatment part 10, the formic acid supply part 20, the catalyst unit 33, and the controller 50.

The soldering apparatus 1 is an apparatus in which a substrate W and an electronic component P as soldering targets are bonded with a solder S. The substrate W and the electronic component P both have a metal portion on a surface thereof, and bonded so that the metal portions can be electrically conductive with each other via the solder. Before transportation into the chamber 11, a temporary fixing agent A is first applied to the substrate W and the solder S is placed on the temporary fixing agent A to fix it temporarily. Further, the temporary fixing agent A is applied to the solder S and the electronic component P is placed on the temporary fixing agent A to fix it temporarily. As described above, the substrate W and the electronic component P are transported into the chamber 11 with the temporary fixing agent A/solder S/temporary fixing agent A interposed therebetween, and the solder S is melted to bond the substrate W and the electronic component P after the temporary fixing agent A is vaporized in the chamber 11.

In the following, the substrate W, the solder S and the electronic component P stacked on top of each other with the solder still unmelted are referred to as "to-be-bonded members B" (the substrate W, the solder S and the electronic component P), and the product obtained by melting the solder S and bonding the substrate W and the electronic component P is referred to as a "soldered product C."

The chamber 11 is configured to make the treatment space 11s airtight by closing a carry-in/out port 11a with a shutter 11d. The material and shape of the chamber 11 are selected so that it can endure even when the pressure in the treatment space 11s is reduced to approximately 10 Pa (absolute pressure). In the chamber 11, a carrier plate 12 on which the to-be-bonded members B are placed, and a heater 13 for heating the carrier plate 12 are provided.

The heater 13 is configured to be able to heat the carrier plate 12 to a bonding temperature that is higher than the melting temperature of the solder.

The formic acid supply part 20 directs the formic acid gas F into the chamber 11. While the formic acid gas F is used as the reducing gas in this description, any gas that can reduce metal oxides formed on the surfaces to be bonded of the substrate W and the electronic component P other than the formic acid gas F may be used. In this description, the formic acid gas F is used from the viewpoint of lowering the reduction temperature to below the melting temperature of the solder and the viewpoint of availability.

The catalyst unit 33 is a device for detoxifying formic acid in the exhaust gas E discharged from the soldering apparatus 1 to such a level the environment is not affected. The term "gas G" is a collective term for the gases discharged from the chamber 11.

A vacuum pump 31 is installed as a pressure reduction pump that discharges the gas G in the chamber 11 so that the pressure in the chamber 11 can be reduced to approximately 10 Pa (absolute pressure).

The controller 50 is configured to be able to open and close the shutter 11d. The controller 50 is also configured to be able to heat the carrier plate 12 by switching between on and off of the heater 13 and varying the output of the heater 13. The controller 50 is also configured to be able to supply the formic acid gas F toward the chamber 11. The controller 50 is also configured to be able to control the start and stop of the vacuum pump 31. In the controller 50, a sequence of operation of the soldering apparatus 1 (which is described later) is stored.

Figure 3:
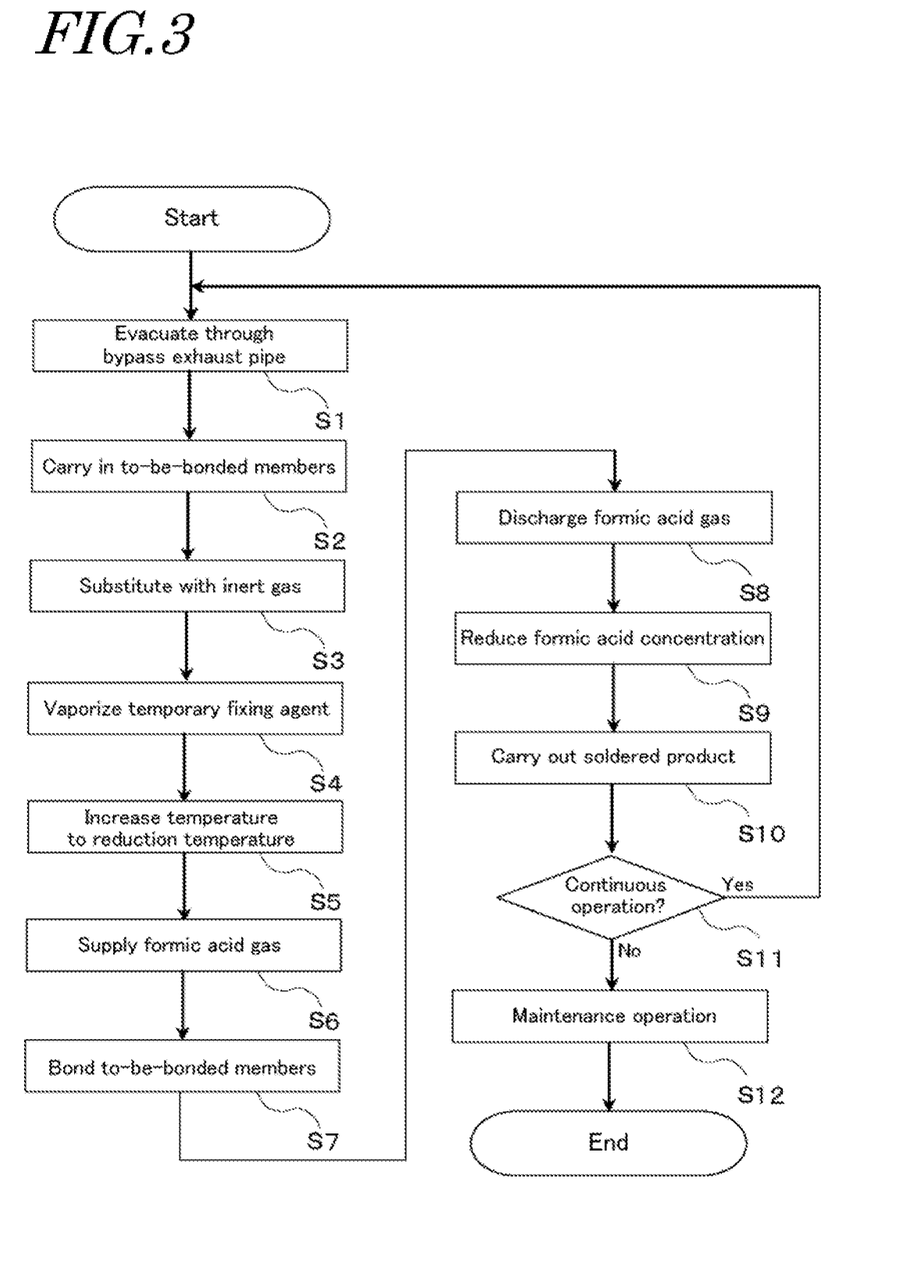
FIG. 3 is a flowchart, illustrating in detail the steps relating to a soldering apparatus in the method for producing a soldered product of the present invention. A case where the soldering apparatus 1 is used is taken for description.

Referring continuously to FIG. 3, a method for producing a soldered product according to an embodiment of the present invention is described in detail in relation to the soldering apparatus. FIG. 3 is a flowchart, illustrating a solder bonding procedure for the soldered product in a case where the soldering apparatus 1 is used. In the following description, when mention is made about the configuration of the soldering apparatus 1, reference is made to FIG. 2 as appropriate.

When a button (not shown) for opening the shutter 11d is pressed in order to carry the to-be-bonded members B into the soldering apparatus 1, the controller 50 activates the vacuum pump 31 to start discharge of the gas G in the chamber 11 (S1) before opening the shutter 11d. Then, the controller 50 moves the carrier plate 12 until most part of the carrier plate 12 is outside the chamber 11. By discharging the gas G in the chamber 11 from the chamber 11 before the shutter 11d is opened, the gas G in the chamber 11 can be prevented from flowing out of the soldering apparatus 1 through the carry-in/out port 11a when the shutter 11d is opened. After the shutter 11d is opened and most part of the carrier plate 12 is moved out of the chamber 11, the to-be-bonded members B are placed on the carrier plate 12. Then, as the carrier plate 12 is moved into the chamber 11, the to-be-bonded members B are carried into the chamber 11 (step of carrying in the to-be-bonded members: S2).

After the to-be-bonded members B are carried into the chamber 11, the controller 50 closes the shutter 11d to make the chamber 11 airtight. Then, in order to remove the atmosphere that has entered the chamber 11 while the shutter 11d was open and create an inert gas atmosphere, the controller 50 discharges the gas G in the chamber 11 and then introduces an inert gas N. By repeating this procedure, the oxygen concentration in the chamber 11 is reduced (step of substituting with an inert gas: S3). The oxygen concentration is preferably 5 ppm or lower. The inert gas N is a nitrogen gas, for example.

Next, the controller 50 turns on the heater 13 to increase the temperature of the carrier plate 12 or, more specifically, the temperature of the to-be-bonded members B, to a temperature at which the temporary fixing agent A vaporizes (evaporates) (S4). As the temperature increases to the vaporization temperature, the temporary fixing agent A evaporates and is removed from the to-be-bonded members B. In this embodiment, the pressure inside the chamber 11 may be reduced to a vacuum (reduced pressure) in order to accelerate the evaporation of the temporary fixing agent A.

While description is made of a case where the vaporization temperature is lower than the reduction temperature in this embodiment, the vaporization temperature may be equal to the following reduction temperature. When the vaporization temperature is equal to the reduction temperature, evaporation of a portion of the temporary fixing agent A and reduction of the to-be-bonded members B occur simultaneously. In other words, there is a case where step (S4) and steps (S5) and (S6) as subsequent steps occur concurrently.

Next, the controller 50 keeps the heater 13 on to increase the temperature of the carrier plate 12 or, more specifically, the temperature of the to-be-bonded members B, to the reduction temperature (S5). The reduction temperature is the temperature at which the oxides on the to-be-bonded members B are reduced by formic acid. When the temperature rise to the reduction temperature is completed, the controller 50 supplies a formic acid gas F from the formic acid supply part 20 into the chamber 11 (S6). Here, in this embodiment, because the reduction temperature is lower than the melting temperature of the solder S, the solder S does not melt, and the formic acid gas penetrates into the gaps formed as a result of vaporization of the temporary fixing agent A and favorably removes oxide film before the to-be-bonded members B are solder-bonded to each other. When the formic acid gas F is supplied after a vacuum is created inside the chamber 11, the formic acid gas F readily penetrates into the gaps. The step of increasing the temperature of the to-be-bonded members B to the reduction temperature (S5) and the step of supplying the formic acid gas F into the chamber 11 (S6) correspond to the reduction steps.

After the reduction steps (S5, S6), the output of the heater 13 is increased, with the atmosphere of the formic acid gas F in the chamber 11 maintained to increase the temperature of the carrier plate 12 or, more specifically, the temperature of the to-be-bonded members B, to the bonding temperature in order to melt the solder and solder-bond the to-be-bonded members B (bonding step: S7). The bonding temperature is any temperature higher than the melting temperature of the solder S, and is 30 to 50° C. higher than the melting temperature in this embodiment.

After the solder on the to-be-bonded members B is melted, the controller 50 turns off the heater 13. By starting cooling, the temperature of the to-be-bonded members B decreases, and the solder solidifies when the temperature falls below its melting point. As a result, the soldered product C is obtained. At this time, the carrier plate 12 may be forcibly cooled to accelerate solidification of the solder. Then, the vacuum pump 31 is activated and a main exhaust valve 41v is opened to discharge the formic acid gas F from the chamber 11 (S8), and the inert gas N is introduced to return the pressure in the chamber 11 to normal pressure. The formic acid gas F discharged from the chamber 11 flows into the catalyst unit 33. The formic acid gas F is subjected to decomposition of the formic acid in the catalyst unit 33, and discharged from the soldering apparatus 1 as an exhaust gas E with a formic acid concentration reduced to a predetermined level or lower and detoxified (S9).

When the soldered product C is carried out of the chamber 11 (S10), the controller 50 determines whether continuous operation is performed (S11). When continuous operation is performed, the procedure returns to the step of discharging the gas G in the chamber 11 (S1). When continuous operation is not performed, maintenance operation is performed (S12).

As described above, according to the soldering apparatus 1, because the devices and units necessary to carry out solder bonding in a vacuum including the treatment part 10, the formic acid supply part 20, the catalyst unit 33 and the controller 50 are housed in the housing 100, solder bonding using the formic acid gas F can be accomplished appropriately and completely within the soldering apparatus 1. In addition, according to the method for producing a soldered product C according to this embodiment, appropriate soldering or vacuum soldering can be carried out using the solder S, the temporary fixing agent A, and the formic acid gas F.

While description is made using the substrate W and the electronic component P as to-be-bonded members B together with the solder S in the above description, the to-be-bonded members may be members other than the substrate W and the electronic component P as long as they have a metal portion suitable for solder bonding on their surfaces.

While the to-be-bonded members B are heated to the bonding temperature and fusion-bonded to each other under an atmosphere of the formic acid gas F in the above description, the to-be-bonded members B are heated to the bonding temperature and fusion-bonded to each other in a vacuum (for example, about 100 Pa (absolute pressure)). When the to-be-bonded members B are solder-bonded to each other after a vacuum is created in the chamber 11, the vacuum in the chamber 11 may be broken by introducing an inert gas N after the heater 13 is turned off. When the inert gas N is introduced after the solder is melted, cavities (voids) can be compressed and squashed. When the solder is solidified after the cavities are squashed, the decrease of fatigue life caused by voids in the solder can be further reduced. When the to-be-bonded members B are fusion-bonded to each other in a vacuum, the treatment and discharge steps (S8, S9) are carried out after the reduction steps (S5, S6).

While the to-be-bonded members B are heated to the bonding temperature and reduced in a vacuum (for example, about 100 Pa (absolute pressure)) in the above description, the reduction steps (S5, S6) and the bonding step (S7) may be carried out to solder-bond the to-be-bonded members B under normal pressure without creating a vacuum.

The method for producing a soldered product of the present application may further comprise a coating step of coating the soldering targets that have undergone solder bonding. Because the solder bonding according to the present invention generates almost no residue, no problem arises about the adhesion with a coating agent. Thus, the soldered portions are appropriately protected when coated in the coating step.

As described above, in the present invention, solder bonding is carried out after the to-be-bonded members as soldering targets are temporarily fixed using a temporary fixing agent. Thus, compared to a conventional method in which a jig is used to carry out solder bonding, solder bonding can be accomplished very easily.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

DESCRIPTION OF REFERENCE NUMERALS AND SYMBOLS 1 soldering apparatus
11 chamber
11s treatment space
20 formic acid supply part
31 vacuum pump
33 catalyst unit
41v main exhaust valve
50 controller
100 housing
A temporary fixing agent
B to-be-bonded members
C soldered product
F reducing gas, formic acid gas
G gas
N inert gas
P electronic component
S solder
W substrate

The invention claimed is:

1. A method for producing a soldered product, comprising:
   a provision step of providing a solder and a temporary fixing agent for temporarily fixing the solder;
   a temporary fixing step of temporarily fixing the solder to a soldering target with the temporary fixing agent;
   a vaporization step of placing the soldering target with the solder temporarily fixed thereto in a vacuum or heating the soldering target with the solder temporarily fixed thereto to a predetermined temperature lower than the melting temperature of the solder, to vaporize the temporary fixing agent in order to form gaps between the solder and the soldering target;
   a reduction step, performed under the vacuum concurrently with or after the vaporization step, of reducing, with a reducing gas at a predetermined temperature lower than the melting temperature the solder and the soldering target;
   a discharging step of discharging the reducing gas;
   a solder melting step, performed after the discharging step, of heating the soldering target to a predetermined temperature equal to or higher than the melting temperature of the solder to melt the solder;
   an inert gas step, performed before the vaporization step, of placing the soldering target with the solder temporarily fixed thereto in an inert gas;
   a vacuum breaking step, performed after the solder melting step, of increasing pressure by introducing an inert gas to break the vacuum in order to compress or eliminate cavities (voids) in the solder; and
   a cooling step, performed after the vacuum breaking step, of cooling the soldering target,
   wherein, in the reduction step, the reduction gas is introduced into the gaps to reduce the soldering target while the soldering target is in a vacuum; and
   wherein, in the solder melting step, the solder is melted by heating the soldering target to a temperature equal to or higher than the melting temperature of the solder after the soldering target is in the vacuum.

2. A method for producing a soldered product, comprising:
   a provision step of providing a solder and a temporary fixing agent for temporarily fixing the solder;
   a temporary fixing step of temporarily fixing the solder to a soldering target with the temporary fixing agent;
   a vaporization step of placing the soldering target with the solder temporarily fixed thereto in a vacuum or heating the soldering target with the solder temporarily fixed thereto to a predetermined temperature lower than the melting temperature of the solder, to vaporize the temporary fixing agent in order to form gaps between the solder and the soldering target;
   a reduction step, performed concurrently with or after the vaporization step, of reducing, with a reducing gas at a predetermined temperature lower than the melting temperature of the solder and the soldering target;
   a discharging step of discharging the reducing gas;
   a solder melting step, performed after the discharging step, of heating the soldering target to a predetermined temperature equal to or higher than the melting temperature of the solder to melt the solder;

an inert gas step, performed before the vaporization step, of placing the soldering target with the solder temporarily fixed thereto in an inert gas;

a vacuum breaking step, performed after the solder melting step, of increasing pressure by introducing an inert gas to break the vacuum in order to compress or eliminate cavities (voids) in the solder; and a cooling step, performed after the vacuum breaking step, of cooling the soldering target, wherein, in the vaporization step, the temporary fixing agent is vaporized by heating the soldering target in a vacuum; and wherein, in the solder melting step, the solder is melted by heating the soldering target to a temperature equal to or higher than the melting temperature of the solder after the soldering target is in the vacuum.

3. The method for producing a soldered product according to claim 2, wherein, in the reduction step, the reduction gas is introduced into the gaps to reduce the soldering target while the soldering target is in a vacuum.

4. The method for producing a soldered product according to claim 1, wherein the solder is a preformed solder;

the temporary fixing agent contains a solvent and a viscosity modifier; and the temporary fixing agent has a boiling point lower than the melting temperature of the solder.

5. The method for producing a soldered product according to claim 1, wherein the solder is a preformed solder;

the temporary fixing agent is a solvent; and the solvent has a boiling point lower than the melting temperature of the solder.

6. The method for producing a soldered product according to claim 1, wherein the reducing gas is a formic acid gas.

7. The method for producing a soldered product according to claim 2, wherein the solder is a preformed solder;

the temporary fixing agent contains a solvent and a viscosity modifier; and the temporary fixing agent has a boiling point lower than the melting temperature of the solder.

8. The method for producing a soldered product according to claim 2, wherein the solder is a preformed solder;

the temporary fixing agent is a solvent; and the solvent has a boiling point lower than the melting temperature of the solder.

9. The method for producing a soldered product according to claim 2, wherein the reducing gas is a formic acid gas.

10. The method for producing a soldered product according to claim 1, wherein the solder is solder powder.

11. The method for producing a soldered product according to claim 2, wherein the solder is solder powder.

* * * * *